United States Patent
Jang et al.

(10) Patent No.: US 10,490,755 B2
(45) Date of Patent: Nov. 26, 2019

(54) DISPLAY APPARATUS

(71) Applicant: Samsung Display Co., Ltd., Yongin-si (KR)

(72) Inventors: Euiyun Jang, Yongin-si (KR); Jeongho Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 56 days.

(21) Appl. No.: 15/668,244

(22) Filed: Aug. 3, 2017

(65) Prior Publication Data

US 2018/0090696 A1  Mar. 29, 2018

(30) Foreign Application Priority Data

Sep. 23, 2016  (KR) .................... 10-2016-0122385

(51) Int. Cl.
| | |
|---|---|
| *G09G 3/30* | (2006.01) |
| *H01L 51/00* | (2006.01) |
| *H01L 27/01* | (2006.01) |
| *H05K 1/02* | (2006.01) |
| *H01L 27/32* | (2006.01) |
| *H01L 51/10* | (2006.01) |

(52) U.S. Cl.
CPC ........ *H01L 51/0096* (2013.01); *H01L 27/013* (2013.01); *H01L 27/32* (2013.01); *H01L 51/107* (2013.01); *H01L 2251/5338* (2013.01); *H05K 1/028* (2013.01); *H05K 2201/10128* (2013.01)

(58) Field of Classification Search
CPC .......... G06F 3/041; G06F 2203/04102; H01L 51/0096; H01L 27/013; H01L 27/32; H01L 51/5253; H01L 51/5281; H05K 1/028
USPC .................................... 345/173, 76, 82, 204
See application file for complete search history.

(56) References Cited

U.S. PATENT DOCUMENTS

| | | |
|---|---|---|
| 2014/0042406 A1 | 2/2014 | Degner et al. |
| 2016/0172427 A1* | 6/2016 | Lee ..................... H01L 27/3276 257/40 |
| 2016/0210894 A1 | 7/2016 | Lee |

FOREIGN PATENT DOCUMENTS

KR  10-2014-0122597  10/2014

* cited by examiner

*Primary Examiner* — Jennifer T Nguyen
(74) *Attorney, Agent, or Firm* — H.C. Park & Associates, PLC

(57) ABSTRACT

A display apparatus including: a substrate including a first area, a second area, and a bending area between the first area and the second area, the substrate being bent with respect to a bending axis extending in a first direction; a display disposed on the first area of the substrate; a panel driver disposed on the second area of the substrate; and a functional film disposed on the second area and the bending area of the substrate, the functional film covering the panel driver and extending to the bending area.

18 Claims, 8 Drawing Sheets

DISPLAY APPARATUS

CROSS-REFERENCE TO RELATED APPLICATION

This application claims priority from and the benefit of Korean Patent Application No. 10-2016-0122385, filed on Sep. 23, 2016, which is hereby incorporated by reference for all purposes as if fully set forth herein.

BACKGROUND

Field

Exemplary embodiments relate to a display apparatus, and more particularly, to a display apparatus in which a long lifespan of the display apparatus may be ensured, and the occurrence of defects, such as disconnection of a wire, may be reduced during a process of manufacturing the display apparatus.

Discussion of the Background

In general, a display apparatus includes a display on a substrate. By at least partially bending the display apparatus, visibility at various angles may be improved, or a size of a non-display area may be decreased.

However, in the case of a display apparatus of the related art, problems such as the occurrence of defects during a process of manufacturing such a bent display apparatus as described above, or a decrease in a lifespan of the display apparatus, may arise.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display apparatus wherein a long lifespan of the display apparatus may be ensured, and the occurrence of defects, such as disconnection of a wire, during a process of manufacturing the display apparatus may be reduced.

Additional aspects will be set forth in the detailed description which follows, and, in part, will be apparent from the disclosure, or may be learned by practice of the inventive concepts.

An exemplary embodiment discloses a display apparatus including: a substrate including a first area, a second area, and a bending area disposed between the first area and second area, the substrate being bent with respect to a bending axis extending in a first direction; a display disposed on the first area of the substrate; a panel driver disposed on the second area of the substrate; and a functional film disposed on the second area and the bending area of the substrate, the functional film covering the panel driver and extending to the bending area.

In the present exemplary embodiment, the functional film may include a film layer and an adhesive layer, wherein the film layer may be located above the substrate with the adhesive layer between the film layer and the substrate.

In the present exemplary embodiment, the film layer may have a first thickness, and the adhesive layer may have a second thickness, wherein the first thickness may be greater than the second thickness.

In the present exemplary embodiment, the first thickness may be about 50 µm to 200 µm.

In the present exemplary embodiment, the second thickness may be about 20 µm to 100 µm.

In the present exemplary embodiment, the film layer may include a black material.

In the present exemplary embodiment, the first area of the substrate may include a display area where the display is located, and a fan-out area between the display area and the bending area, and the functional film may at least partially cover the fan-out area.

In the present exemplary embodiment, the functional film may include a first portion covering the bending area and having a first length and a first width, a second portion extending in a direction from the bending area toward the first area and having a second length and a second width, and a third portion extending in a direction from the bending area toward the second area and having a third length and a third width, wherein the first length and the second length may be the same as each other, and the third length may be less than the first length or the second length.

In the present exemplary embodiment, a width of the functional film may be a sum of the first width, the second width, and the third width.

In the present exemplary embodiment, the display apparatus may further include a protective film, wherein the substrate may include a surface on which the display is located and another surface at a side opposite to the surface on which the display is located, the protective film being on the other surface of the substrate.

In the present exemplary embodiment, the protective film may be located outside the bending area.

In the present exemplary embodiment, the display apparatus may further include a strain control film on the functional film, the strain control film corresponding to the bending area.

In the present exemplary embodiment, a thickness of a portion of the functional film that corresponds to the bending area and a thickness of a portion of the functional film that does not correspond to the bending area may be different from each other.

In the present exemplary embodiment, a portion of the functional film that corresponds to the bending area may be thicker than a portion of the functional film that does not correspond to the bending area.

In the present exemplary embodiment, a portion of the functional film that corresponds to the panel driver may include a black material to radiate heat.

In the present exemplary embodiment, the functional film may be spaced apart from the display by a predetermined distance.

In the present exemplary embodiment, the bending area may have constant curvature when bent, and a thickness of a portion of the functional film that corresponds to the bending area may be proportional to the curvature of the bending area.

In the present exemplary embodiment, the display apparatus may further include a flexible printed circuit board configured to be electrically connected to the panel driver.

In the present exemplary embodiment, the display may include an organic light-emitting device and an encapsulation layer encapsulating the organic light-emitting device.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concepts.

DETAILED DESCRIPTION OF THE ILLUSTRATED EMBODIMENTS

Figure 1:
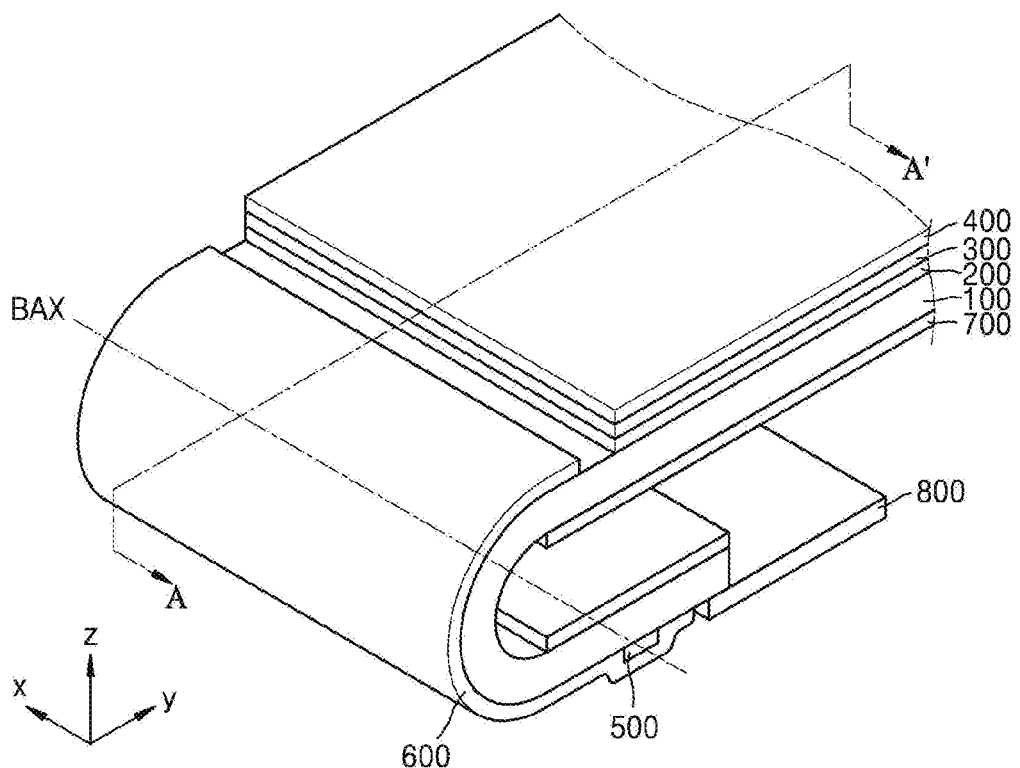
FIG. 1 is a schematic perspective view of a display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
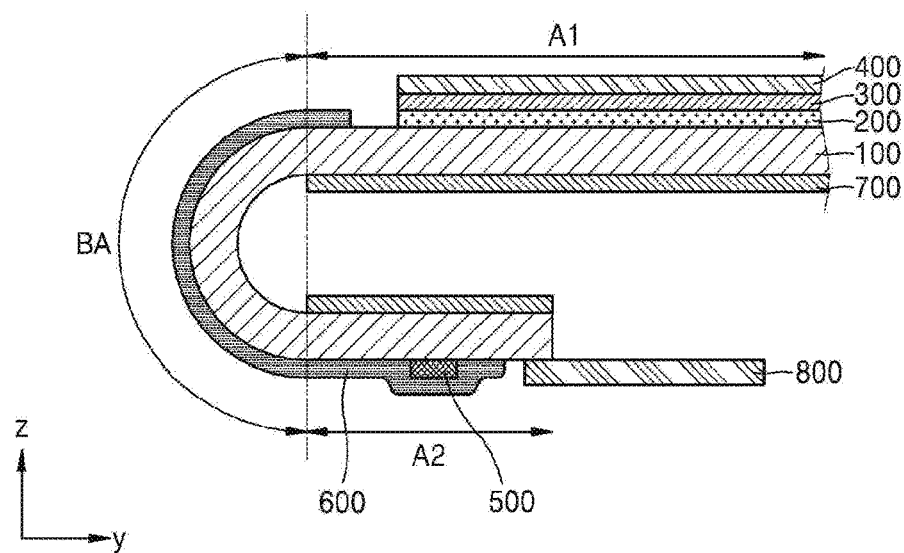
FIG. 2 is a schematic cross-sectional view of the display apparatus of FIG. 1, taken along line A-A'.
Figure 3:
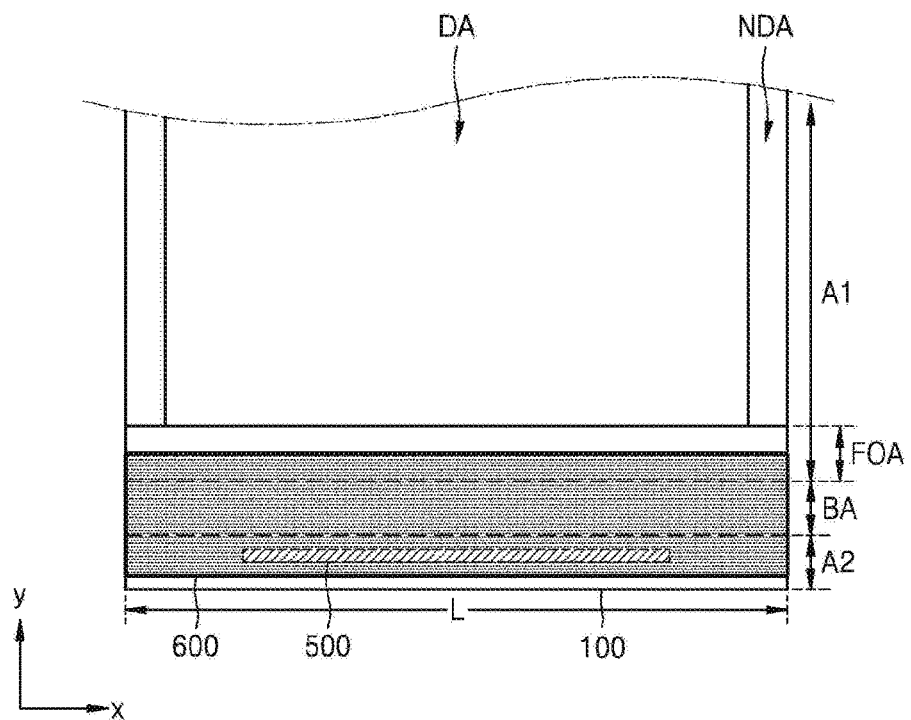
FIG. 3 is a schematic plan view of a portion of the display apparatus of FIG. 1 before bending.

FIG. 1 is a schematic perspective view of a display apparatus according to an exemplary embodiment. FIG. 2 is a schematic cross-sectional view of the display apparatus of FIG. 1, taken along line A-A'. FIG. 3 is a schematic plan view of a portion of the display apparatus of FIG. 1 prior to bending.

As shown in FIGS. 1 and 2, in the display apparatus according to the present exemplary embodiment, a substrate 100, which is a portion of the display apparatus, is in a partially bent state, and thus, the display apparatus is partially bent in accordance with the substrate 100. However, for convenience of description, some drawings, including FIG. 3, illustrate the display apparatus when it is not in a bent state. For reference, cross-sectional views and plan views related to the exemplary embodiments that will be described later also illustrate, for convenience of illustration and convenience of description, a display apparatus that is not in a bent state.

Referring to FIGS. 1 to 3, a display apparatus according to an exemplary embodiment includes the substrate 100 having a first area A1, a second area A2, and a bending area BA disposed between the first area A1 and the second area A2, a display 200 disposed on the first area A1 of the substrate 100, a panel driver 500 disposed on the second area A2 of the substrate 100, and a functional film 600.

The substrate 100 has the bending area BA extending in a first direction (x direction). In a second direction (y direction) crossing the first direction (x direction), the bending area BA is located between the first area A1 and the second area A2. Also, as shown in FIG. 1, the substrate 100 is bent with respect to a bending axis BAX extending in the first direction (x direction).

The substrate 100 may include various materials having flexible or bendable characteristics. For example, the substrate 100 may include a polymer resin, such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

The first area A1 includes a display area DA. As shown in FIG. 2, the first area A1 includes a portion of a non-display area NDA outside the display area DA. The second area A2 also includes the non-display area NDA.

The display 200 may be disposed on the display area DA of the first area A1. The display 200 may include a display device and may display an image to the outside by controlling emission of the display device. The display device may include, for example, an organic light-emitting device OLED (refer to FIG. 13) and/or a liquid crystal device. When the display device is the organic light-emitting device OLED, the display 200 may further include an encapsulation layer 70 (refer to FIG. 13) covering the organic light-emitting device OLED. The encapsulation layer 70 may encapsulate and block the organic light-emitting device OLED from the outside, thereby maintaining desirable characteristics of the organic light-emitting device OLED, which is vulnerable to oxygen and moisture.

Although not illustrated, the display 200 may include, in addition to the display device, a thin film transistor TFT electrically connected to the display device and controlling emission of the display device.

A touch sensor 300 may be provided on the display 200. The touch sensor 300 may obtain coordinate information regarding an input point by sensing external touch information and using the external touch information as an input signal. The touch sensor 300 may be mounted on the display 200 as a separate unit, or may be directly formed on the display 200 so as to be "built-in".

A polarizer 400 may be located on the touch sensor 300. Although not illustrated, an adhesive layer may be disposed between the polarizer 400 and the touch sensor 300. Similarly, the adhesive layer may also be disposed between the touch sensor 300 and the display 200. The adhesive layer may be a transparent adhesive layer. For example, the adhesive layer may be an optically clear adhesive (OCA). However, exemplary embodiments are not limited thereto, and alternatively, the adhesive layer may be an optically clear resin (OCR). In another exemplary embodiment, the adhesive layer may include a pressure sensitive adhesive (PSA). The PSA may include a cured polymer. The PSA is in the form of a film including an adhesive and performs an adhesive function in response to externally provided pressure. The PSA may include an acrylic-based or rubber-based adhesive, or an adhesive that contains particles, such as zirconia particles, in the above adhesive.

The panel driver 500 may be disposed on the second area A2. The panel driver 500 is connected to a pad portion of the substrate 100 and transmits a data signal and a gate signal (hereinafter simply referred to as "signals") to a gate line and a data line. The panel driver 500 may be, for example, a driver integrated circuit (IC), and may be mounted on the pad portion of the substrate 100. In this case, the pad portion may be electrically connected to the driver IC directly.

In another exemplary embodiment, a flexible printed circuit board (FPCB) 800 may be mounted on the pad portion of the substrate 100, and the driver IC may be mounted on the FPCB 800. The FPCB 800 may be a chip-on-film (COF) or a flexible printed circuit (FPC), and the driver IC transmitting the signals to allow a plurality of pixels of the display 200 to emit light may be mounted on the FPCB 800.

The functional film 600 may be disposed on the panel driver 500. As shown in FIG. 2, the functional film 600 may be located on the second area A2 of the substrate 100 so as to cover the panel driver 500. The functional film 600 may externally radiate heat generated from the panel driver 500. Although FIG. 3 illustrates the functional film 600 as having a rectangular shape, such a shape is merely exemplary and the inventive concept is not so limited. Other shapes for the functional film will be sufficient as long as the functional film 600 entirely covers the panel driver 500.

Also, the functional film 600 may extend to edges of the substrate 100. That is, the functional film 600 may have the same size as a width of the substrate 100 in an x direction. The functional film 600 extending to the edges of the substrate 100 may prevent fractures in the edges of the substrate 100. However, a width L of the functional film 600 in the x direction is not limited thereto. In another exemplary embodiment, the functional film 600 may not extend to the edges of the substrate 100 and may be spaced apart from the edges of the substrate 100 within a predetermined distance tolerance.

As described above, the functional film 600 may be located on the second area A2 of the substrate 100 so as to cover the panel driver 500 and may extend to the bending area BA. That is, the functional film 600 may cover the second area A2 and the bending area BA of the substrate 100. When the substrate 100 is bent at the bending area BA, the functional film 600 disposed on the bending area BA may relieve strain applied to various wires, as well as to the substrate 100 and an insulation layer disposed on the substrate 100.

Although, in FIG. 2, ends of the display 200, the touch sensor 300, and the polarizer 400 are aligned with one another, the inventive concept is not limited thereto. As described above, the display 200 may include the organic light-emitting device OLED, the thin film transistor TFT, and the encapsulation layer 70 covering the organic light-emitting device OLED and the thin film transistor TFT. In particular, an end of the encapsulation layer 70 may extend beyond the touch sensor 300 and the polarizer 400. In general, the polarizer 400 may be disposed to contact the functional film 600, or similarly may be disposed adjacent to the functional film 600. Although, in the present exemplary embodiment, the polarizer 400 and the functional film 600 are spaced apart from each other, the inventive concept is not limited thereto.

The substrate 100 has a surface and another surface on a side opposite thereto, and the display 200 may be located on the surface of the substrate 100. A protective film 700 may be located on the other surface of the substrate 100, which is opposite the surface on which the display 200 is located. The protective film 700 may be attached on the other surface of the substrate 100 to protect the display apparatus. Although not illustrated, the protective film 700 may be attached on the other surface of the substrate 100 via an adhesive layer. As shown in FIGS. 1 and 2, the protective film 700 may be located on the first area A1 and the second area A2 of the substrate 100 and may not be located on the bending area BA. In another exemplary embodiment, the protective film 700 may be located over the entirety of the other surface of the substrate 100, that is, the first area A1, the second area A2, and the bending area BA.

Referring to FIG. 3, the first area A1 of the substrate 100 may include the display area DA and a fan-out area FOA. The display 200 may be located on the display area DA of the substrate 100, and the fan-out area FOA may be located between the display area DA and the bending area BA. In the present exemplary embodiment, the functional film 600 may at least partially cover the fan-out area FOA. That is, the functional film 600 may be located on the second area A2 so as to cover the panel driver 500 and may extend toward the first area A1 and cover the bending area BA and a portion of the fan-out area FOA. As shown in FIG. 3, the functional film 600 may be spaced apart from the display 200 within a predetermined distance tolerance.

In this case, the functional film 600 may cover a portion of the second area A2 and a portion of the fan-out area FOA but may cover the entire surface of the bending area BA. This is because, when the substrate 100 is bent, the functional film 600 relieves strain of the substrate 100 and various layers located on the substrate 100 with respect to the bending area BA.

Figure 4:
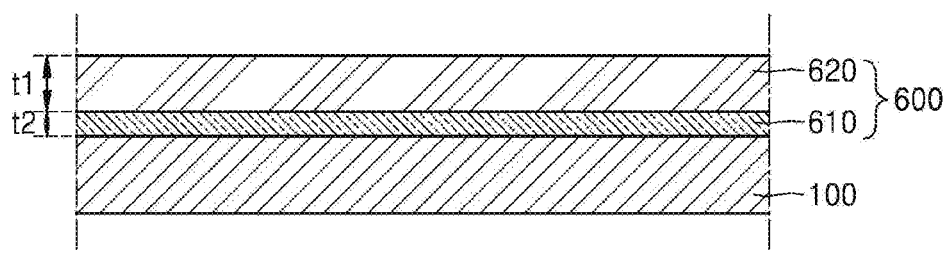
FIG. 4 is a schematic cross-sectional view of a functional film according to an exemplary embodiment.

FIG. 4 is a schematic cross-sectional view of the functional film 600 according to an exemplary embodiment.

Although FIG. 4 illustrates, for convenience of illustration, the functional film 600 directly located on the substrate 100, the inventive concept is not limited thereto. As shown in FIG. 4, the functional film 600 may be directly located on the substrate 100, or an insulation layer and/or a metal layer including various devices and wires may be formed on the substrate 100, and the functional film 600 may be located thereon.

Referring to FIG. 4, the functional film 600 may include a film layer 620 and an adhesive layer 610. The film layer 620 may be located above the substrate 100 with the adhesive layer 610 disposed therebetween. The film layer 620 may include a plastic material, graphite, or a metal material having flexible characteristics, and in some cases, a surface of the film layer 620 may be coated with various materials.

Regarding the functional film 600, the adhesive layer 610 may include a generally transparent or semi-transparent material, whereas the film layer 620 may have a certain color. In the present exemplary embodiment, the film layer 620 may include a black material that absorbs heat efficiently. For example, the black material may include graphite, metal particles of aluminum (Al), copper (Cu), nickel (Ni), silver (Ag), etc., or a rubber-based or acrylic-based material. Accordingly, the film layer 620 may have a black color or a similar dark color.

For example, the functional film 600 may be formed by coating, with a material having excellent thermal conductivity, the film layer 620 including PET, for example, by depositing graphite on a base film under high vacuum through a vacuum deposition or sputtering process. In another exemplary embodiment, when graphite is used to form the functional film 600, the functional film 600 may have a stacked structure of graphite layers, and stacked graphite layers therefore form the functional film 600 as flake graphite is foamed and rolled with high pressure. Here, since the functional film 600 including graphite exhibits a black color, a heat absorption rate increases, and thus, the functional film 600 has high thermal conductivity. Accordingly, heat transferred to the functional film 600 effectively spreads over the entire functional film 600. In another exemplary embodiment, apart from graphite, metal particles of aluminum (Al), copper (Cu), nickel (Ni), silver (Ag), etc. having excellent thermal conductivity, or a rubber-based or acrylic-based material may be used to form the functional film 600.

Each of the film layer 620 and the adhesive layer 610 may have a predetermined thickness. The film layer 620 may have a first thickness t1, the adhesive layer 610 may have a second thickness t2, and the first thickness t1 and the second thickness t2 may be different from each other. That is, thicknesses of the film layer 620 and the adhesive layer 610 may be different from each other. In the present exemplary embodiment, the first thickness t1 of the film layer 620 may be greater than the second thickness t2 of the adhesive layer 610. For example, the first thickness t1 of the film layer 620 may be about twice that of the second thickness t2 of the adhesive layer 610, the first thickness t1 of the film layer 620 may be about 50 μm to 200 μm, and the second thickness t2 of the adhesive layer 610 may be about 20 μm to 100 μm. Because the film layer 620 performs the main heat-radiating function as compared with the adhesive layer 610, an excellent heat-radiating function may be obtained when the film layer 620 is thicker than the adhesive layer 610.

In another exemplary embodiment, each area of the functional film 600 may have a different color. As described above, the functional film 600 may be located on the second area A2 so as to cover the panel driver 500 and may extend toward the first area A1 and be located on the bending area BA and at least a portion of the fan-out area FOA. In this case, a portion of the functional film 600 on the second area A2 is used to radiate heat of the panel driver 500, and a portion of the functional film 600 on the bending area BA is used to relieve strain of a display panel when bent. Accordingly, with respect to heat radiation, the functional film 600 may have a black color or a similar dark color in the portion on the second area A2 used for radiating heat.

In other words, a portion of the functional film 600 other than the portion on the second area A2 does not necessarily need to be black. A magnitude of strain applied to the display panel when bent may be determined by taking into account various variables, such as a thickness of the display panel, a bending angle, a curvature of the bending area BA, and a width of the bending area BA. In this case, the portion of the functional film 600 other than the portion on the second area A2 may have various colors according to the magnitude of strain.

Figure 5:
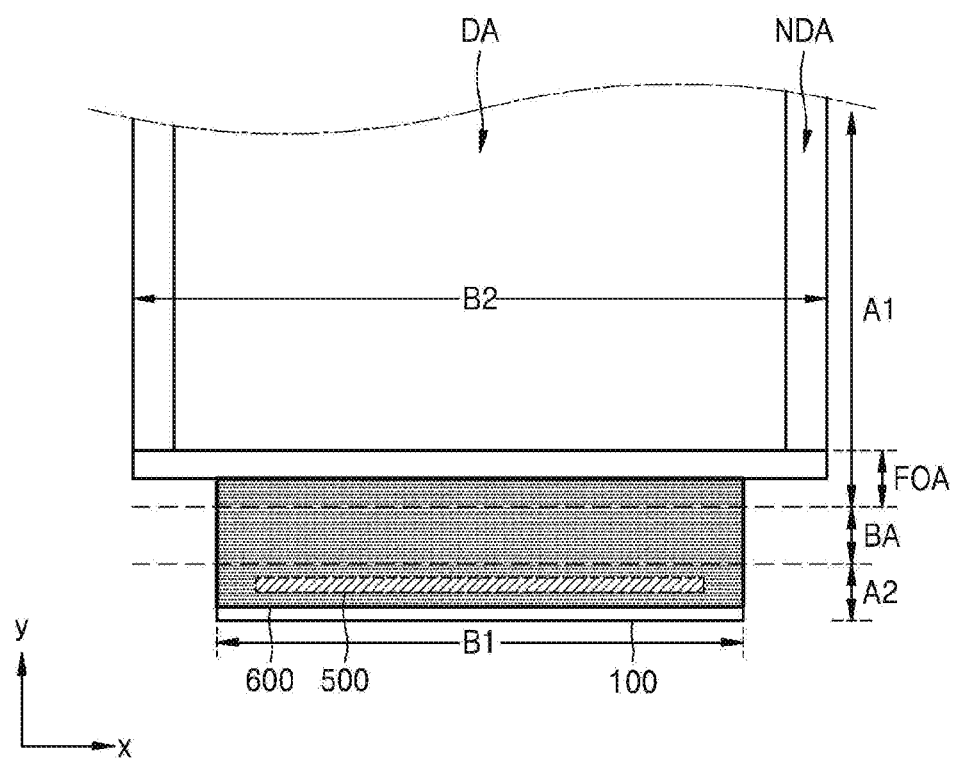
FIG. 5 is a schematic plan view of a portion of a display apparatus before bending, according to another exemplary embodiment.
Figure 6:
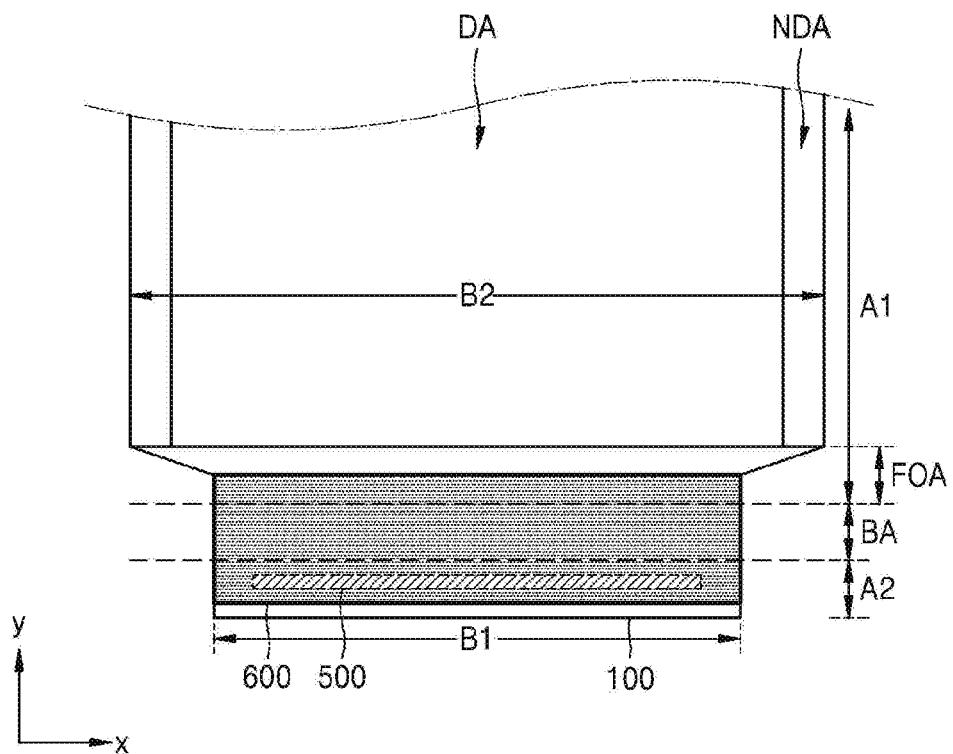
FIG. 6 is a schematic plan view of a portion of a display apparatus before bending, according to another exemplary embodiment.

Each of FIGS. 5 and 6 is a schematic plan view of a portion of a display apparatus before bending, according to another exemplary embodiment.

The exemplary embodiment illustrated in FIG. 5 differs from the previous exemplary embodiments in terms of a shape of the substrate 100. That is, in the present exemplary embodiment, a width B1 of the substrate 100 in a region including the bending area BA, the second area A2, and a portion of the fan-out area FOA may be less than a width B2 of the substrate 100 in the first area A1 including the display area DA. Here, the widths B1 and B2 of the substrate 100 may be understood as referring to the widths B1 and B2 extending along the X-axis of the substrate 100. That is, in the present exemplary embodiment, the substrate 100 may not have a rectangular shape, and a side of the substrate 100 may have a decreased width.

As a method of forming the above shape, the substrate 100 may be cut by a laser or the like, and then, various layers including the panel driver 500 may be disposed on the substrate 100, or various layers including the panel driver 500 may be formed on a rectangular substrate first, and then, the substrate may be cut by a laser or the like to form the above shape. In this case, before a shape of the substrate is processed, the functional film 600 may be attached onto the substrate and be processed along with the substrate, or after a shape of the substrate is processed, the functional film 600 may be attached onto the substrate.

In another exemplary embodiment, as shown in FIG. 6, a width of the substrate 100 may gradually decrease in at least a portion of the fan-out area FOA.

Figure 7:
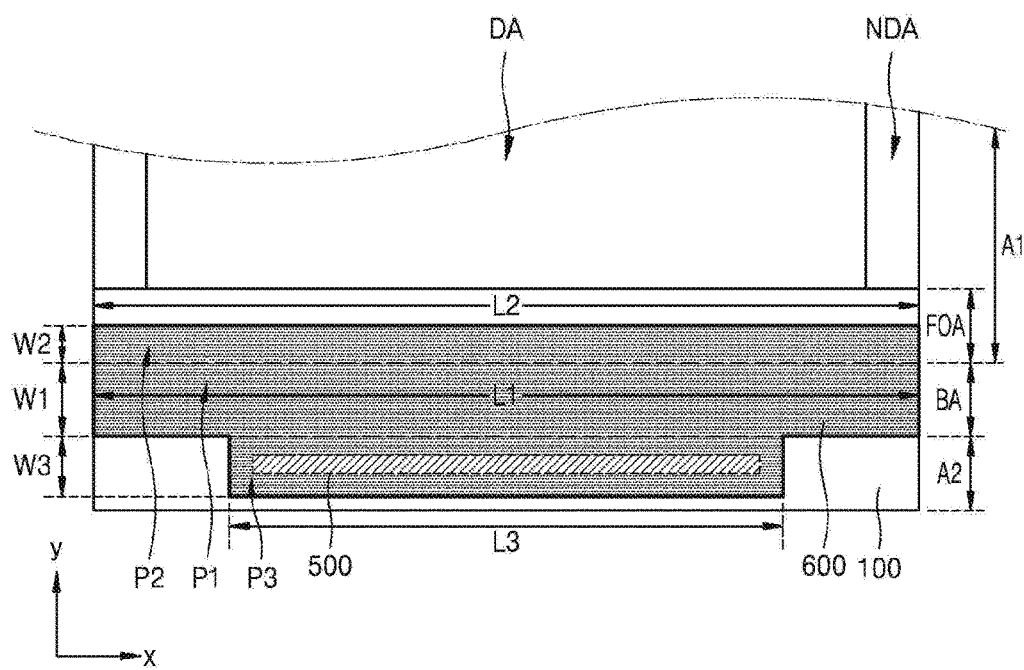
FIG. 7 is a schematic plan view of a portion of a display apparatus before bending, according to an exemplary embodiment.
Figure 8:
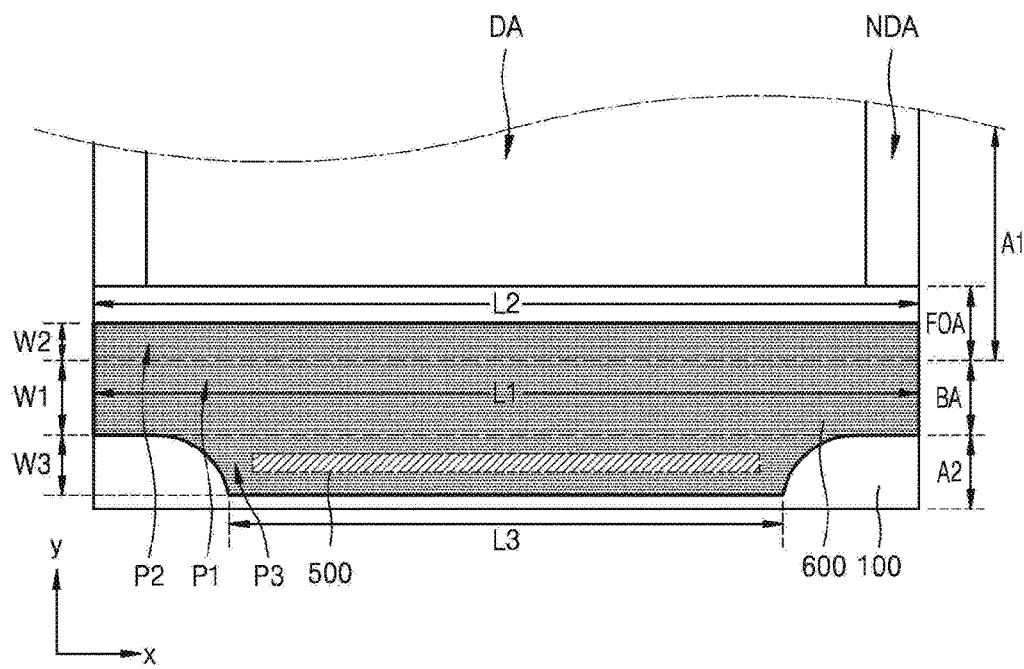
FIG. 8 is a schematic plan view of a portion of a display apparatus before bending, according to an exemplary embodiment.

FIG. 7 is a schematic plan view of a portion of a display apparatus prior to bending, according to another exemplary embodiment. FIG. 8 is a schematic plan view of a portion of a display apparatus prior to bending, according to another exemplary embodiment.

Referring to FIGS. 7 and 8, the present exemplary embodiments are similar to the display apparatus of FIG. 3 but differ in a shape of the functional film 600. Since the present exemplary embodiments are the same as the previous exemplary embodiment of FIG. 3 except for the shape of the functional film 600, repeated descriptions thereof will be omitted here.

In the present exemplary embodiments, the functional film 600 may include a first portion P1 located on the bending area BA, a second portion P2 extending from the bending area BA toward the first area A1 and located on the first area A1, and a third portion P3 extending from the bending area BA toward the second area A2 and located on the second area A2. The first portion P1 of the functional film 600 may have a first length L1 and a first width W1, the second portion P2 may have a second length L2 and a second width W2, and the third portion P3 may have a third length L3 and a third width W3. Here, a length may be understood as referring to a length extending in a first direction (x direction), and a width may be understood as referring to a width extending in a second direction (y direction). The length and the width are the same as will be described below. In the present exemplary embodiments, a width of the functional film 600 may be represented as a sum of the first width W1, the second width W2, and the third width W3.

In the present exemplary embodiments, the first length L1 of the first portion P1 and the second length L2 of the second portion P2 of the functional film 600 may be equal to each other, and the third length L3 of the third portion P3 may be less than the first length L1 or the second length L2. The reason for this difference is that a length of the panel driver 500 is less than a length of the substrate 100 in the first direction (x direction), and thus, regarding the third portion P3 of the functional film 600 covering the panel driver 500, it is sufficient that the functional film 600 is disposed to just cover the panel driver 500.

Figure 9:
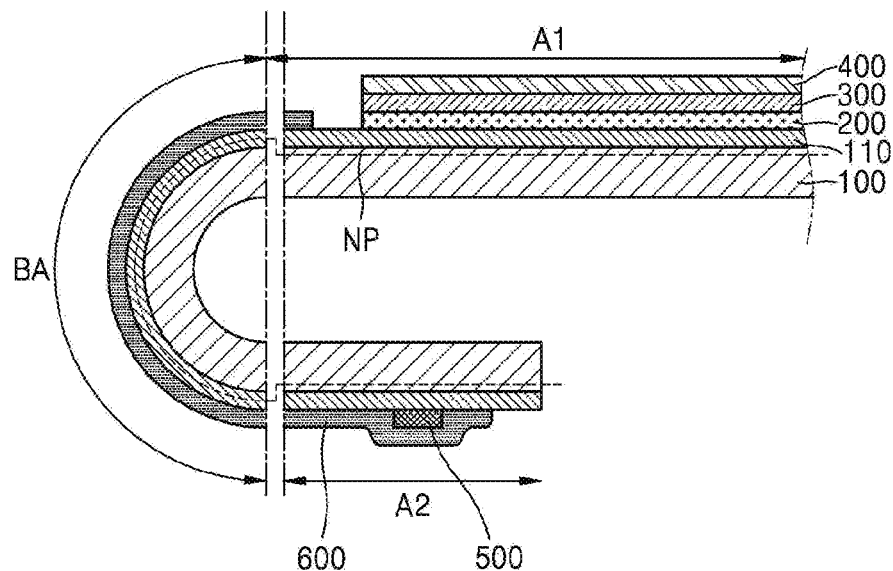
FIG. 9 is a schematic cross-sectional view of a portion of a display apparatus according to an exemplary embodiment.

FIG. 9 is a schematic cross-sectional view of a portion of a display apparatus according to an exemplary embodiment.

Referring to FIG. 9, the substrate 100 according to the present exemplary embodiment may have the first area A1, the second area A2, and the bending area BA between the first area A1 and the second area A2. Regarding the bending area BA of the substrate 100, the bending area BA is bent at a constant curvature around the bending axis BAX, and in this case, a strain is applied to a display panel. Here, the display panel, which includes the substrate 100 and various devices and layers including the display 200 on the substrate 100, may be understood as members disposed under the touch sensor 300. In other words, a compressive strain is relatively applied to the substrate 100 located at an inner side of a curved surface of the bending area BA, a tensile strain is relatively applied to a layer located at an outer side of the curved surface of the bending area BA, and such a strain is transferred to the display panel.

As described above, when the compressive strain and the tensile strain are applied to the bending area BA, a neutral plane NP exists in the bending area BA, and the farther the display panel is from the neutral plane NP, the stronger the compressive strain or the tensile strain received by the display panel. Here, the neutral plane NP may be defined as a location where the compressive strain and the tensile strain are 0 (zero). When the compressive strain or the tensile strain is repeatedly applied to the display panel or exceeds a limit of strain which each layer can bear, a thin film transistor included in the display panel may be damaged, a wire connected to each pixel may fracture, or an interlayer delamination phenomenon may occur. Accordingly, in the display apparatus according to the present exemplary embodiment, a location of the neutral plane NP in the bending area BA may be moved by extending the functional film 600, which performs a function of radiating heat generated from the panel driver 500, to the bending area BA. Thus, damage to a device and a wire due to a bending strain may be prevented, and the interlayer delamination phenomenon may be decreased.

As shown in FIG. 9, in the present exemplary embodiment, a layer 110 is disposed between the substrate 100 and the functional film 600, and the layer 110 between the substrate 100 and the functional film 600 may be a wiring layer, an insulation layer, or a combined layer of a wiring layer and an insulation layer. As described above, a location of the neutral plane NP in the bending area BA may be moved to the layer 110 by extending the functional film 600 to the bending area BA.

The neutral plane NP may be in the first area A1 and the second area A2 of the substrate 100, which are not bent. As described above, the compressive strain or the tensile strain is greater further away from the neutral plane NP. Accordingly, in the display apparatus according to the present exemplary embodiment, the neutral plane NP in the bending area BA may be moved to various layers formed on the substrate 100 by extending the functional film 600 covering the panel driver 500 to the bending area BA. As a result, strain applied to the various layers formed on the substrate 100 may be decreased, and thus, damage to a device and a wire due to strain generated in the bending area BA by bending may be prevented.

As described above, the functional film 600 may control strain of the bending area BA of the substrate 100. In an exemplary embodiment, the functional film 600 may have various colors according to a state of strain in the bending area BA. That is, the functional film 600 varying in color according to a magnitude of strain applied to the bending area BA may be provided. Thus, the state of strain of the bending area BA may be visually monitored from the outside.

Figure 10:
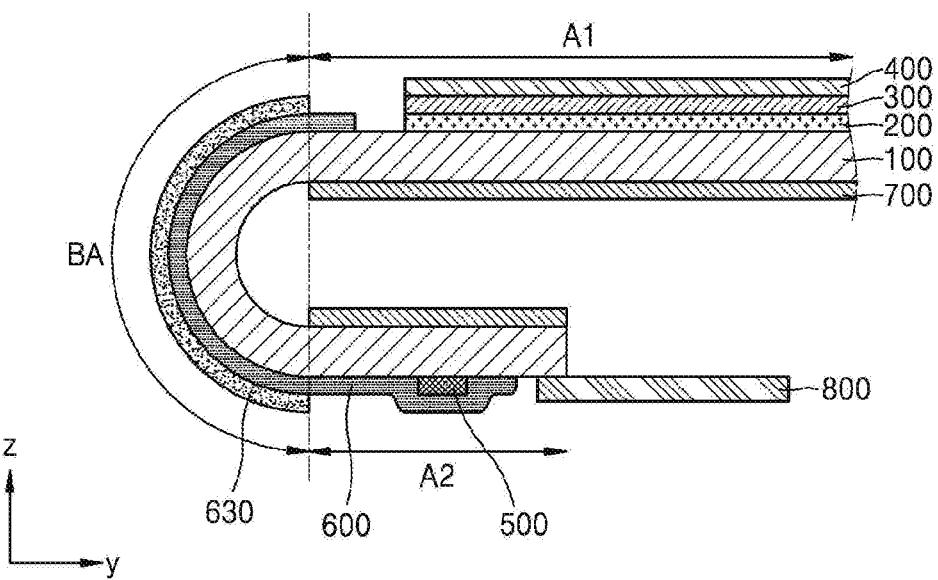
FIG. 10 is a schematic cross-sectional view of a portion of a display apparatus according to an exemplary embodiment.

FIG. 10 is a schematic cross-sectional view of a portion of a display apparatus according to an exemplary embodiment.

Referring to FIG. 10, the display apparatus according to the present exemplary embodiment differs from the previous exemplary embodiments in that the display apparatus according to the present exemplary embodiment further includes a strain control film 630 on the functional film 600. Since, apart from the strain control film 630, the display apparatus according to the present exemplary embodiment is the same as the previous exemplary embodiments, repeated descriptions thereof will be omitted here.

The strain control film 630 may be disposed on the functional film 600. Although not illustrated, the strain control film 630 may include a film layer and an adhesive layer, as does the functional film. In another exemplary embodiment, the strain control film 630 may be coated on the functional film 600.

The strain control film 630 may be located on the functional film 600 so as to correspond to the bending area BA of the substrate 100. The strain control film 630 may have a predetermined thickness, and the neutral plane NP may be moved by controlling a material and/or a thickness of the strain control film 630.

Figure 11:
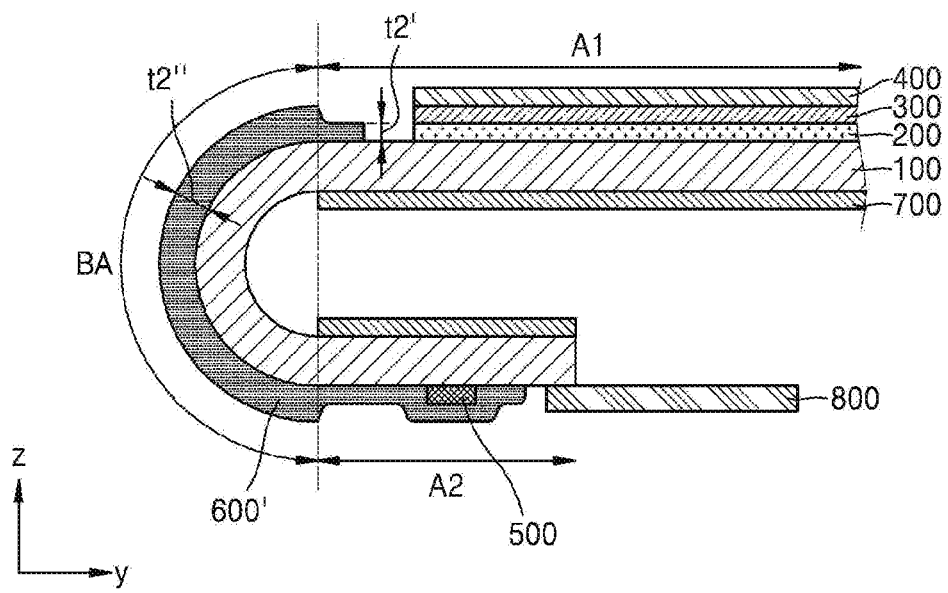
FIG. 11 is a schematic cross-sectional view of a portion of a display apparatus according to an exemplary embodiment.

FIG. 11 is a schematic cross-sectional view of a portion of a display apparatus according to an exemplary embodiment.

Referring to FIG. 11, the display apparatus according to the present exemplary embodiment differs from the previous exemplary embodiments in that each portion of the functional film 600 has a different thickness. Since, apart from the functional film 600, the display apparatus according to the present exemplary embodiment is the same as the previous exemplary embodiments, repeated descriptions thereof will be omitted here.

The functional film 600 according to the present exemplary embodiment may be disposed mainly on the bending area BA and partially over the first area A1 and the second area A2. In this case, respective thicknesses of the functional film 600 on the bending area BA, the first area A1, and the second area A2 may be different from one another. As described above, the neutral plane NP may be moved by disposing the functional film 600 on the bending area BA, and a location of the neutral plane NP may be adjusted by controlling a thickness of the functional film 600. As shown in FIG. 11, a portion of the functional film 600 that corresponds to the bending area BA may be thicker than portions of the functional film 600 that correspond to the first area A1 and the second area A2, that is, portions that are not bent. Although not illustrated, the functional film 600 may include the adhesive layer 610 and the film layer 620, and the thickness of the functional film 600 may be implemented by forming the film layer 620 to be partially thick, forming the adhesive layer 610 to be partially thick, or forming the film layer 620 and the adhesive layer 610 to be partially thick.

In another exemplary embodiment, a bending area of a substrate may be bent to have constant curvature, and a thickness of a portion of a functional film that corresponds to the bending area may be proportional to the curvature of the bending area. In other words, the greater the curvature of the bending area, the stronger is the strain applied to the substrate. Accordingly, by forming the portion of the functional film that corresponds to the bending area to be thick according to the curvature of the bending area, strain at the bending area may be relieved.

Figure 12:
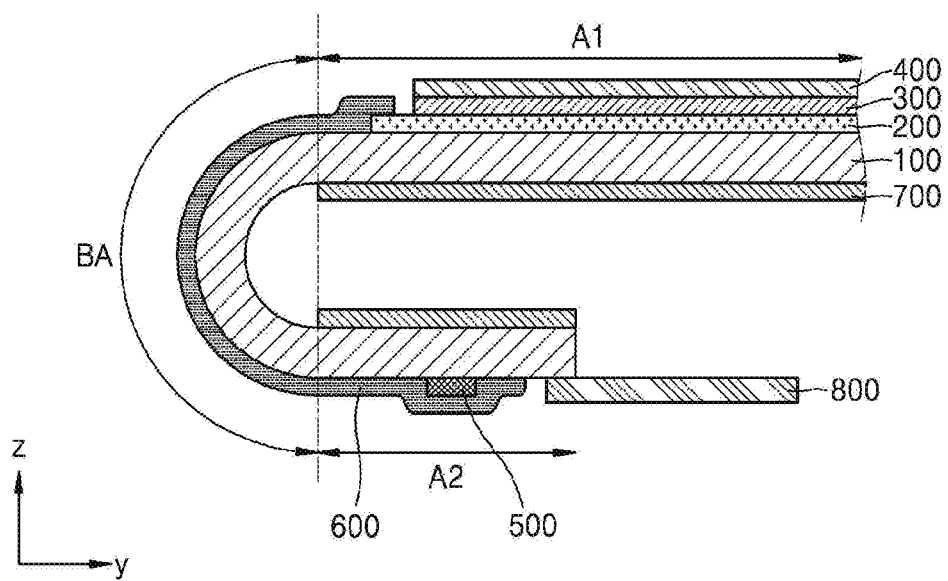
FIG. 12 is a schematic cross-sectional view of a portion of a display apparatus according to an exemplary embodiment.

FIG. 12 is a schematic cross-sectional view of a portion of a display apparatus according to an exemplary embodiment.

Referring to FIG. 12, in the present exemplary embodiment, an end of the display 200 may extend farther than ends of the touch sensor 300 and the polarizer 400. Here, that the end of the display 200 extends farther than the ends of the touch sensor 300 and the polarizer 400 may be construed as meaning that an end of the encapsulation layer 70 of the display 200 extends farther than the ends of the touch sensor 300 and the polarizer 400. As described above, the display 200 may include the organic light-emitting device OLED, the thin film transistor TFT, and the encapsulation layer 70 covering the organic light-emitting device OLED and the thin film transistor TFT, and the encapsulation layer 70 must be disposed so as to cover the organic light-emitting device OLED and the thin film transistor TFT. Accordingly, the encapsulation layer 70 may be disposed over a broader area than the touch sensor 300 and the polarizer 400 as well as the organic light-emitting device OLED and the thin film transistor TFT.

As shown in FIG. 12, an end of the functional film 600 may be disposed to cover the end of the display 200. This may be construed as meaning that the functional film 600 covers the end of the encapsulation layer 70. The encapsulation layer 70 may have a multi-layer structure in which an organic layer and an inorganic layer are alternately stacked, and the inorganic layer may extend farther than the organic layer. In this case, the functional film 600 may be disposed to cover an end of the inorganic layer. In another exemplary embodiment, the functional film 600 may contact the encapsulation layer 70 or may be disposed adjacent to the encapsulation layer 70.

Figure 13:
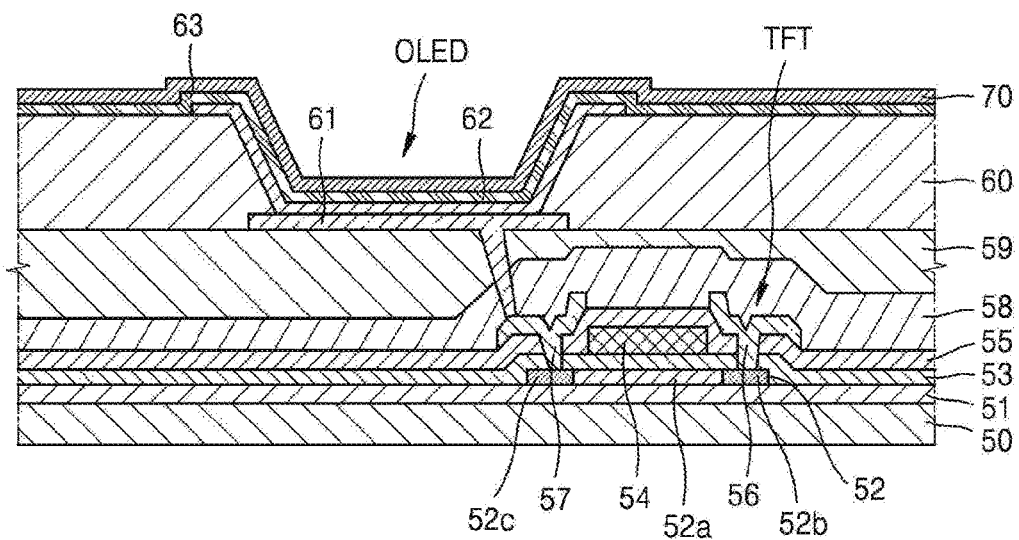
FIG. 13 is a schematic cross-sectional view of a pixel of a display apparatus according to an exemplary embodiment.

FIG. 13 is a schematic cross-sectional view of a pixel of a display apparatus according to an exemplary embodiment.

Referring to FIG. 13, various elements of the display apparatus are formed over a substrate 50. Here, the substrate 50 may be the substrate 100 described with reference to FIG. 1 and the like, or may be a cut portion of the substrate 100. The substrate 50 may include a transparent material, for example, glass, plastic, or metal.

Common layers, such as a buffer layer 51, a gate insulation layer 53, and an interlayer insulation layer 55, may be formed over the entire surface of the substrate 50; a patterned semiconductor layer 52 including a channel area 52a, a source contact area 52b, and a drain contact area 52c may be formed; and a gate electrode 54, a source electrode 56, and a drain electrode 57 may be formed, which together with the patterned semiconductor layer 52 constitutes the thin film transistor TFT.

Also, a protective layer 58 covering the thin film transistor TFT and a planarization layer 59 disposed on the protective layer 58 and having a substantially flat upper surface may be formed over the entire surface of the substrate 50. The organic light-emitting device OLED including a patterned pixel electrode 61, an opposite electrode 63 substantially corresponding to the entire surface of the substrate 50, and an intermediate layer 62 disposed between the pixel electrode 61 and the opposite electrode 63 and having a multi-layer structure including an emission layer may be located on the planarization layer 59. However, unlike what is illustrated in FIG. 13, some layers of the intermediate layer 62 may be common layers substantially corresponding to the entire surface of the substrate 50, and some other layers of the intermediate layer 62 may be pattern layers patterned so as to correspond to the pixel electrode 61. The pixel electrode 61 may be electrically connected to the thin film transistor TFT through a via hole. A pixel-defining layer 60 covering edges of the pixel electrode 61 and having an opening defining each pixel area may be formed on the planarization layer 59 so as to substantially correspond to the entire surface of the substrate 50.

The encapsulation layer 70 covering the organic light-emitting device OLED may be disposed on the organic light-emitting device OLED. The encapsulation layer 70 may block the organic light-emitting device OLED from the outside and thus encapsulate the organic light-emitting device OLED, thereby maintaining characteristics of the organic light-emitting device OLED which are vulnerable to oxygen and moisture.

As described above, according to one or more exemplary embodiments, a display apparatus is provided wherein a long lifespan of the display apparatus may be ensured, and the occurrence of defects, such as disconnection of a wire, during a process of manufacturing the display apparatus may be reduced. However, the inventive concept is not limited by such an effect.

Although certain exemplary embodiments and implementations have been described herein, other exemplary embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display apparatus comprising:
    a substrate comprising a first area, a second area, and a bending area between the first area and second area, the substrate configured to be bent with respect to a bending axis extending in a first direction;
    a display disposed on the first area of the substrate;
    a panel driver disposed on the second area of the substrate; and
    a functional film disposed on the second area and the bending area of the substrate, the functional film covering the panel driver and extending to the bending area,
    wherein the functional film comprises a film layer and an adhesive layer, the adhesive layer being disposed between the film layer and the substrate, the adhesive layer having a higher adhesive property than the film layer, and
    wherein the film layer and an adhesive layer are formed as one body and have the same area in a plan view.

2. The display apparatus of claim 1, wherein the film layer has a first thickness, and the adhesive layer has a second thickness greater than the first thickness.

3. The display apparatus of claim 2, wherein the first thickness is about 50 μm to 200 μm.

4. The display apparatus of claim 2, wherein the second thickness is about 20 μm to 100 μm.

5. The display apparatus of claim 1, wherein:
    the first area of the substrate comprises a display area where the display is located, and a fan-out area disposed between the display area and the bending area, and
    the functional film at least partially covers the fan-out area.

6. The display apparatus of claim 1, further comprising a protective film, wherein the substrate comprises a first surface on which the display is disposed and a second surface disposed at a side opposite the first surface on which the display is located, the protective film being disposed on the second surface of the substrate.

7. The display apparatus of claim 6, wherein the protective film is located outside the bending area.

8. The display apparatus of claim 1, further comprising a strain control film disposed on the functional film, the strain control film corresponding to the bending area.

9. The display apparatus of claim 1, wherein a thickness of a portion of the functional film that corresponds to the bending area and a thickness of a portion of the functional film that does not correspond to the bending area are different from each other.

10. The display apparatus of claim 1, wherein a portion of the functional film that corresponds to the bending area is thicker than a portion of the functional film that does not correspond to the bending area.

11. The display apparatus of claim 1, wherein a portion of the functional film that corresponds to the panel driver comprises a black material configured to radiate heat.

12. The display apparatus of claim 1, wherein the functional film is spaced apart from the display by a predetermined distance.

13. The display apparatus of claim 1, wherein the bending area is bent to have constant curvature, and a thickness of a portion of the functional film that corresponds to the bending area is proportional to the curvature of the bending area.

14. The display apparatus of claim 1, further comprising a flexible printed circuit board configured to be electrically connected to the panel driver.

15. The display apparatus of claim 1, wherein the display comprises an organic light-emitting device and an encapsulation layer encapsulating the organic light-emitting device.

16. The display apparatus of claim 1, wherein the film layer comprises a black material for radiating heat.

17. A display apparatus comprising:
    a substrate comprising a first area, a second area, and a bending area between the first area and second area, the substrate configured to be bent with respect to a bending axis extending in a first direction;
    a display disposed on the first area of the substrate;
    a panel driver disposed on the second area of the substrate;
    a functional film disposed on the second area and the bending area of the substrate, the functional film covering the panel driver and extending to the bending area,
    wherein:
    the functional film comprises:
        a first portion covering the bending area and having a first length and a first width;
        a second portion extending in a direction from the bending area toward the first area and having a second length and a second width; and a third portion extending in a direction from the bending area toward the second area and having a third length and a third width; and the first length and the second length are the same as each other, and the third length is less than the first length or the second length.

18. The display apparatus of claim 17, wherein a width of the functional film is a sum of the first width, the second width, and the third width.

\* \* \* \* \*